United States Patent
Nakagawa et al.

(10) Patent No.: US 10,613,433 B2
(45) Date of Patent: Apr. 7, 2020

(54) METHOD FOR PRODUCING SUBSTRATE WITH FINE PROJECTION-AND-RECESS PATTERN, AND SUBSTRATE WITH FINE PROJECTION-AND-RECESS PATTERN OBTAINED THEREBY

(71) Applicant: TOHOKU UNIVERSITY, Miyagi (JP)

(72) Inventors: Masaru Nakagawa, Miyagi (JP); Takuya Uehara, Miyagi (JP); Kazuro Nagase, Gifu (JP); Hiroaki Ikedo, Gifu (JP)

(73) Assignee: TOHOKU UNIVERSITY, Sendai-shi, Miyagi (JP)

( * ) Notice: Subject to any disclaimer, the term of this patent is extended or adjusted under 35 U.S.C. 154(b) by 454 days.

(21) Appl. No.: 15/507,688

(22) PCT Filed: Aug. 25, 2015

(86) PCT No.: PCT/JP2015/004275
§ 371 (c)(1),
(2) Date: Feb. 28, 2017

(87) PCT Pub. No.: WO2016/031237
PCT Pub. Date: Mar. 3, 2016

(65) Prior Publication Data
US 2017/0293221 A1  Oct. 12, 2017

(30) Foreign Application Priority Data

Aug. 29, 2014  (JP) .................................. 2014-176213

(51) Int. Cl.
*G03F 7/00* (2006.01)
*H01L 21/027* (2006.01)
*B29C 59/02* (2006.01)

(52) U.S. Cl.
CPC .......... *G03F 7/0002* (2013.01); *B29C 59/022* (2013.01); *H01L 21/0271* (2013.01)

(58) Field of Classification Search
CPC .. G03F 7/0002; H01L 21/0271; B29C 59/022
See application file for complete search history.

(56) References Cited

U.S. PATENT DOCUMENTS

2003/0198897 A1  10/2003  Nebashi et al.
2013/0032971 A1  2/2013  Omatsu et al.

FOREIGN PATENT DOCUMENTS

JP    H11334048 A    12/1999
JP    2005533393 A   11/2005
(Continued)

OTHER PUBLICATIONS

International Search Report dated Nov. 24, 2015 in PCT/JP2015/004275 with English translation, 4 pages.

*Primary Examiner* — Robert J Grun
(74) *Attorney, Agent, or Firm* — Muncy, Geissler, Olds & Lowe, P.C.

(57) ABSTRACT

A method for producing a substrate with a fine projection-and-recess pattern which is excellent in productivity and achieves excellent pattern feature size and accuracy is provided. The method for producing a substrate with a fine projection-and-recess pattern 50 by photo-nanoimprint lithography includes: a first step S1 of applying a photocurable composition 2 to a substrate 1 to form a composition-applied substrate 10; a second step S2 of pressing a mold 20 provided with a fine projection-and-recess pattern into contact with the composition-applied substrate 10 to mold the photocurable composition 2 into recesses 5a and projections 5b; a third step S3 of irradiating the photocurable composition 2 with an active energy line to cure the photocurable composition 2 of the recesses 5a and the projections 5b and peeling off the mold 20; a fourth step S4 of removing the (Continued)

cured recesses 5a and etching the substrate 1 located on the lower surface of the recesses 5a; and a fifth step S5 of removing the cured projections 5b. At the first step S1, the photocurable composition 2 is applied to the substrate 1 by printing using a printing plate.

8 Claims, 11 Drawing Sheets

(56) References Cited

FOREIGN PATENT DOCUMENTS

| | | | |
|---|---|---|---|
| JP | 2010287793 | A | 12/2010 |
| JP | 2011222732 | A | 11/2011 |
| JP | 2012254603 | A | 12/2012 |
| JP | 2013074015 | A | 4/2013 |
| JP | 2013222937 | A | 10/2013 |
| JP | 2014037083 | A | 2/2014 |

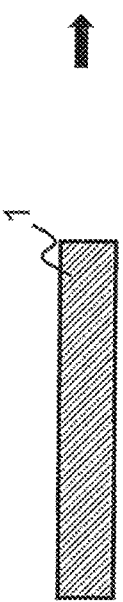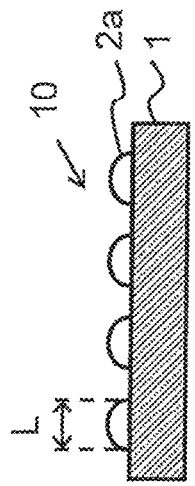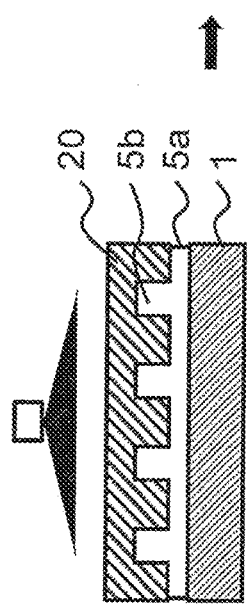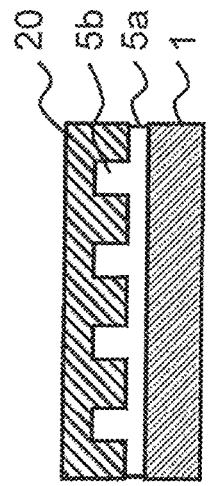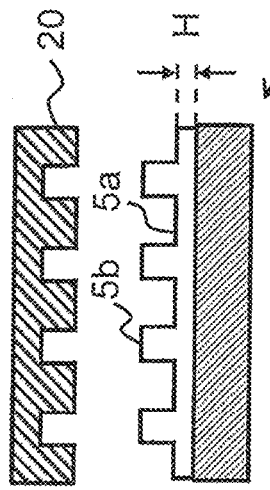

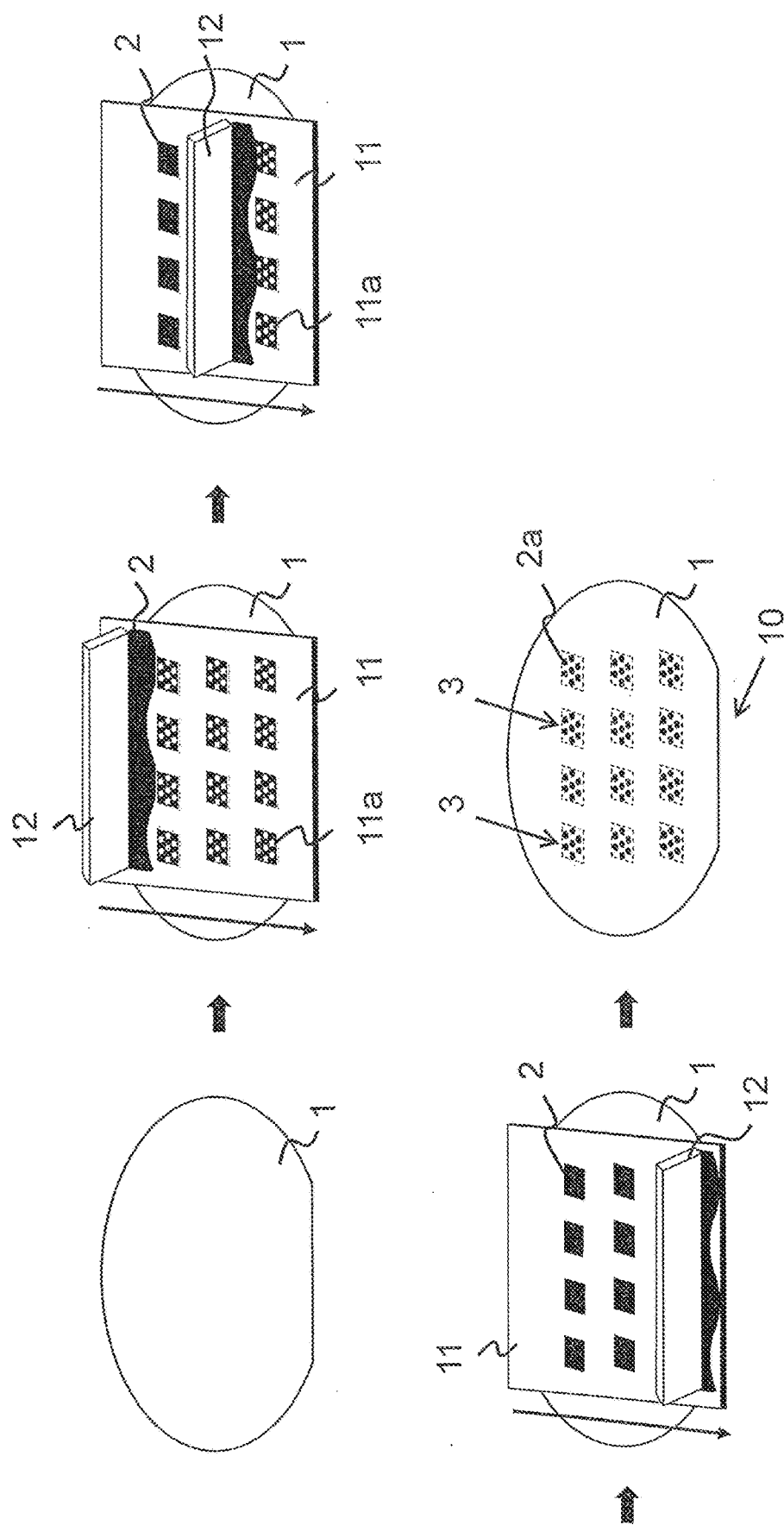

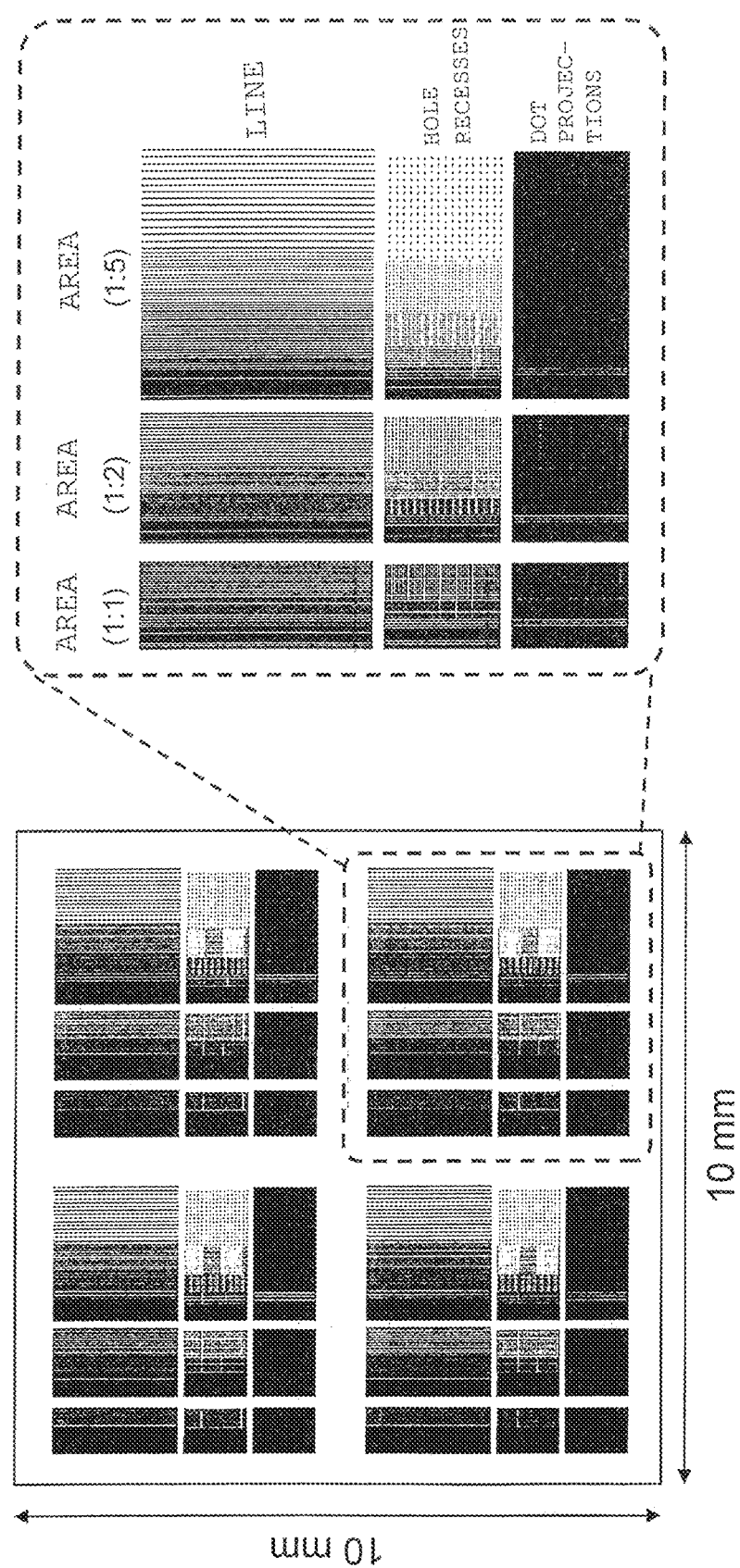

METHOD FOR PRODUCING SUBSTRATE WITH FINE PROJECTION-AND-RECESS PATTERN, AND SUBSTRATE WITH FINE PROJECTION-AND-RECESS PATTERN OBTAINED THEREBY

TECHNICAL FIELD

The present invention relates to a method for producing a substrate with a fine projection-and-recess pattern, and a substrate with a fine projection-and-recess pattern obtained by the method, and more specifically a method for producing a substrate with a fine projection-and-recess pattern which method is excellent in productivity and achieves excellent pattern feature size and accuracy, and a substrate with a fine projection-and-recess pattern obtained by the method.

BACKGROUND ART

With the progress of IT, the diversification of the usage, and other circumstances, there has been desired a substrate with a fine projection-and-recess pattern, such as a semiconductor device having a finer pattern formed therein. However, so-called photolithography techniques have the disadvantage of requiring an expensive stepper and photomask for forming a finer pattern, and therefore, the development of a novel production technique that can supersede the photolithography has been demanded.

In 1995, Professor Chou of University of Minnesota, et al. proposed a nanoimprint lithography technique as a technique to replicate a substrate with a fine projection-and-recess pattern at low cost.

Such nanoimprint lithography is a method in which, not by using a conventional photolithography technique, but by using an electron-beam lithography technique which is currently poor in productivity, a mold provided with projections and recessions ranging from several tens to several hundreds of nm in a surface thereof is pressed into contact with a thin thermoplastic resin film on a substrate to transfer a fine pattern to the film, and using the molded thin resin film as a resist mask or a deposition mask, a substrate with a fine projection-and-recess pattern is produced.

This method includes a thermal cycle step configured with heating, pressurization, maintenance, cooling, decompression, and mold-peeling, and is therefore called thermal nanoimprint lithography.

By contrast, there is a method called photo-nanoimprint lithography, in which, using a mold and a photocurable composition that is a low-viscosity liquid, a pattern of a cured-resin obtained by curing the photocurable composition is formed on a substrate. The photo-nanoimprint lithography does not need a heating and cooling step, and accordingly, resin molding can be performed at high speed at a constant temperature, such as room temperature.

As an example of the method to form a pattern of a cured-resin on a substrate by using a mold, there has been known a method of positioning a mold and a substrate with a gap held between the mold and the substrate; substantially filling the gap with a low viscosity photocurable composition having a viscosity measured at 25° C. of less than 30 millipascal seconds (30 mPa·s); and curing the photocurable composition by light irradiation (for example, refer to PTL 1).

In the method for producing a substrate with a fine projection-and-recess pattern by photo-nanoimprint lithography, as a process to apply a photocurable composition on a substrate, there has been commonly performed: a pattern formation process (for example, refer to PTL 2) including the steps of applying a photocurable composition for photo-nanoimprinting onto a substrate by a spin-coating process to form a pattern formation layer, pressing a mold into contact with a surface of the pattern formation layer, and irradiating the pattern formation layer with light; or a pattern formation process (for example, refer to PTL 3) including the steps of applying a photocurable composition for photo-nanoimprinting onto a substrate or a mold having a fine pattern by an ink-jet printing process, and irradiating the photocurable composition for photo-nanoimprinting with light, with the photocurable composition being sandwiched between the mold and the substrate.

CITATION LIST

Patent Literature

PTL 1: Japanese Unexamined Patent Application Publication (Translation of PCT Application) No. 2005-533393 (JP-T-2005-533393)

PTL 2: Japanese Patent Application Laid-Open No. 2010-287793 (JP-A-2010-287793)

PTL 3: Japanese Patent Application Laid-Open No. 2013-74015 (JP-A-2013-74015)

SUMMARY OF INVENTION

Technical Problem

However, in the pattern formation process described in PTL 2, a spin-coating process is made use of, and accordingly, a photocurable composition for photo-nanoimprinting is applied also to a portion to which the photocurable composition for photo-nanoimprinting does not need to be applied, and thus, the thickness of a so-called residual layer tends to be non-uniform.

Furthermore, as a fine projection-and-recess pattern formed in a substrate is smaller in size, the initial thickness of a film formed by the spin-coating process needs to be smaller. When the initial thickness of a film is small, the film tends not to be maintained uniform due to dewetting, for example.

As a result, the resulting substrate with a fine projection-and-recess pattern is inferior in pattern feature size and accuracy.

In the pattern formation process described in PTL 3, an ink-jet process is made use of, and accordingly, a photocurable composition for photo-nanoimprinting can be applied to a proper portion of a substrate, but, the application takes some time, thereby leading to poor productivity.

Both of the above-mentioned spin-coating process and ink-jet process require the use of a low viscosity photocurable composition, and such a low viscosity photocurable composition has a weak intermolecular force, thereby having a low resin density after cured and a low resistance to reactive ion etching and plasma etching, and the resulting substrate with a fine projection-and-recess pattern is inferior in pattern feature size and accuracy.

Furthermore, such a low viscosity photocurable composition contains a large amount of a low molecular weight monomer and a solvent serving as volatile components, and accordingly, the components volatilize after the application of the photocurable composition before the press-contact of a mold, whereby a change in physical properties (for example, a change in viscosity) is caused, and as a result, the thickness of a so-called residual layer tends to be non-uniform. Thus, the resulting substrate with a fine projection-and-recess pattern is inferior in pattern feature size and accuracy.

In view of the above-mentioned circumstances, an object of the present invention is to provide a method for producing a substrate with a fine projection-and-recess pattern which method is excellent in productivity and achieves excellent pattern feature size and accuracy, and to provide a substrate with a fine projection-and-recess pattern obtained by the method.

Solution to Problems

To solve the above-mentioned problems, the present inventors earnestly studied and found that the application of a photocurable composition to a substrate by printing using a printing plate allowed the above-mentioned problems to be solved, and the inventors have completed the present invention.

The present invention provides (1) a method for producing a substrate with a fine projection-and-recess pattern by photo-nanoimprint lithography, the method comprising: a first step of applying a photocurable composition to a substrate to form a composition-applied substrate: a second step of pressing a mold provided with a fine projection-and-recess pattern into contact with the composition-applied substrate to mold the photocurable composition into projections and recesses; a third step of irradiating the photocurable composition with an active energy line to cure the photocurable composition of the projections and the recesses and peeling off the mold; a fourth step of removing the cured recesses and etching the substrate located on the lower surface of the recesses: and a fifth step of removing the cured projections, in which, at the first step, the photocurable composition is applied to the substrate by printing using a printing plate.

The present invention provides (2) the method for producing a substrate with a fine projection-and-recess pattern according to the (1), in which, at the first step, the photocurable composition is applied to a plurality of portions of the substrate by one time printing using a printing plate.

The present invention provides (3) the method for producing a substrate with a fine projection-and-recess pattern according to the (1) or the (2), in which the mold is moved laterally to repeat the second step and the third step for every printed portion of the substrate to which the photocurable composition is applied.

The present invention provides (4) the method for producing a substrate with a fine projection-and-recess pattern according to any one of the (1) to the (3), in which the photocurable composition has a viscosity of 100 mPa·s or higher.

The present invention provides (5) the method for producing a substrate with a fine projection-and-recess pattern according to any one of the (1) to the (4), in which the printing using a printing plate is permeographic printing, and the printing plate has a thickness of 5 µm to 200 µm and an opening ratio of 10% to 40%.

The present invention provides (6) the method for producing a substrate with a fine projection-and-recess pattern according to the (5), in which openings of the printing plate have a dot shape or a line shape.

The present invention provides (7) the method for producing a substrate with a fine projection-and-recess pattern according to any one of the (1) to the (6), in which standard deviation of the thickness of the cured recesses is 10% or less of the thickness.

The present invention provides (8) a substrate with a fine projection-and-recess pattern obtained by the method for producing a substrate with a fine projection-and-recess pattern according to any one of the (1) to the (7).

Advantageous Effects of Invention

In the method for producing a substrate with a fine projection-and-recess pattern according to the present invention, a photocurable composition is applied to a substrate by printing using a printing plate, and thus, the photocurable composition can be applied to proper portions of the substrate at a time. Therefore, the productivity is considerably increased, compared with conventional printing without using a printing plate, such as ink-jet printing.

Furthermore, the use of printing using a printing plate enables the use of a high viscosity photocurable composition, thereby allowing the content of a solvent component (a volatile component) in the photocurable composition to be considerably reduced. This can prevent a change in the physical properties of the photocurable composition due to the volatilization of the solvent component from the application of the photocurable composition until the press-contact of a mold. As a result, later-mentioned cured recesses (a so-called residual layer) can be made uniform in thickness.

Furthermore, the photocurable composition on the substrate hardly changes with passage of time, and therefore, for example, a plurality of the composition-applied substrates can be stored with being accommodated in a cassette. In this case, the composition-applied substrates can be suitably taken out of the cassette and used in a production step.

Furthermore, the production method allows the content of the solvent component to be reduced, and hence, is excellent as a so-called volatile organic compound (VOC) countermeasure.

Note that, as the photocurable composition, a high viscosity photocurable composition having a viscosity of 100 mPa·s or more is suitably used.

Hence, according to the above-mentioned method for producing a substrate with a fine projection-and-recess pattern, excellent productivity is achieved, and furthermore, a substrate with a fine projection-and-recess pattern obtained by the method is excellent in pattern feature size and accuracy.

At the first step of the method for producing a substrate with a fine projection-and-recess pattern according to the present invention, a photocurable composition is applied to a plurality of arbitrary portions on a substrate by one time printing using a printing plate, and thus, the photocurable composition can be easily applied only to necessary portions. This can prevent that excessive photocurable composition is extruded into projections of a mold, thereby causing the resulting residual layer to be non-uniform in thickness.

Furthermore, excessive photocurable composition can be prevented from being applied, and accordingly, cost reduction can be achieved and the thickness of the residual layer can be prevented from being larger than needed.

In the method for producing a substrate with a fine projection-and-recess pattern according to the present invention, the mold is moved laterally to repeat the second step and the third step for every printed portion of a substrate to which a photocurable composition is applied, and thus, the photocurable composition can be easily molded into projections and recesses.

Furthermore, when the above-mentioned pressing is successively performed, the productivity can be further increased.

In the method for producing a substrate with a fine projection-and-recess pattern according to the present invention, when the printing using a printing plate is permeographic printing, and the printing plate has a thickness of 5 μm to 200 μm and an opening ratio of 10% to 40%, the thickness of the residual layer can be reduced as much as possible, and a necessary and sufficient amount of the photocurable composition can be applied.

Furthermore, when openings of the printing plate have a dot shape or a line shape, the drainage of the photocurable composition is good, and the photocurable composition can be applied with good reproducibility.

In the method for producing a substrate with a fine projection-and-recess pattern according to the present invention, when the standard deviation of the thickness of the cured recesses, in other words, the film thickness of a so-called residual layer is 10% or less of the thickness (the film thickness), the pattern feature size and accuracy are more excellent.

The substrate with a fine projection-and-recess pattern according to the present invention can be obtained by the above-mentioned method for producing a substrate with a fine projection-and-recess pattern, and is therefore excellent in pattern feature size and accuracy.

BRIEF DESCRIPTION OF DRAWINGS

FIG. 2 is a partial cross-sectional view to describe an outline of the method for producing a substrate with a fine projection-and-recess pattern according to the present embodiment.

FIG. 3 is an explanatory diagram to describe a first step in the method for producing a substrate with a fine projection-and-recess pattern according to the present embodiment.

FIG. 5 illustrates a pattern provided in a mold used in Examples.

DESCRIPTION OF EMBODIMENTS

Figure 1:
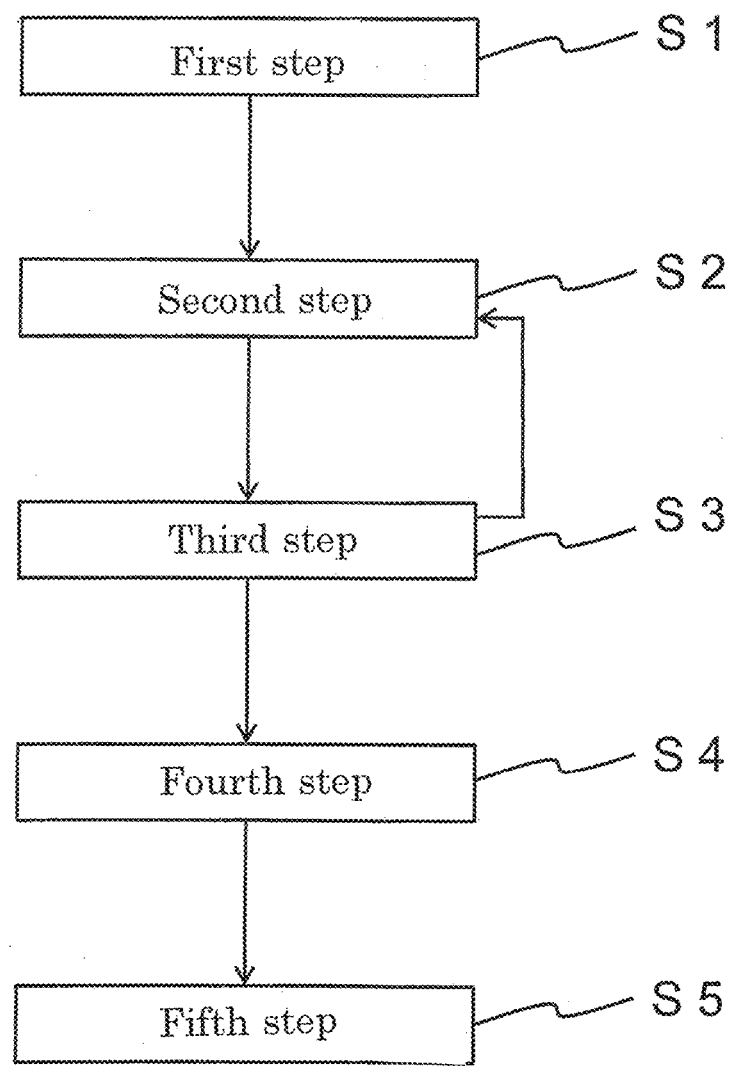
FIG. 1 is a flow chart illustrating a method for producing a substrate with a fine projection-and-recess pattern according to the present embodiment.

Hereinafter, a preferred embodiment of the present invention will be described in detail with reference to the drawings as needed. Note that, in the drawings, the same components are indicated by the same reference numerals, and redundant explanations are omitted. Unless otherwise noted, positional relationships, such as up, down, right, and left, are based on positional relationships illustrated in the drawings. Furthermore, the dimensional ratios in the drawings are not limited to the illustrated ratios.

A method for producing a substrate with a fine projection-and-recess pattern according to the present embodiment is conducted by photo-nanoimprint lithography.

Therefore, unlike conventional methods by photolithography, the method according to the present embodiment allows a substrate with a 1 μm or less fine projection-and-recess pattern to be produced at low cost without using a stepper and a photomask.

FIG. 1 is a flow chart illustrating the method for producing a substrate with a fine projection-and-recess pattern according to the present embodiment.

As illustrated in FIG. 1, the method for producing the substrate according to the present embodiment comprises: a first step S of applying a photocurable composition to a substrate to form a composition-applied substrate; a second step S2 of pressing a mold provided with a fine projection-and-recess pattern into contact with the composition-applied substrate to mold the photocurable composition into projections and recesses; a third step S3 of irradiating the photocurable composition with an active energy line to cure the photocurable composition of the projections and the recesses and peeling off the mold; a fourth step S4 of removing the cured recesses and etching the substrate located on the lower surface of the recesses; and a fifth step S5 of removing the cured projections.

Here, the type (material) of the above-mentioned substrate is not limited to a particular one, and a well-known material may be suitably used.

Examples of the substrate to be used include a silicon wafer, a silicon carbide wafer, a sapphire wafer, a gallium phosphide wafer, a gallium arsenide wafer, an indium phosphide wafer, a gallium nitride wafer, a glass wafer, and a glass wafer with a metal film.

The shape of the substrate is not limited to a particular shape as long as the substrate has a surface to which a photocurable composition can be applied by printing using a printing plate, and, for example, a disc-shaped substrate may be used.

The composition of the above-mentioned photocurable composition is not limited to a particular one, and a well-known photocurable composition may be suitably used.

For example, use may be made of a photocurable composition containing a photopolymerization initiator and an acrylate-based, methacrylate-based, epoxy-based, polyvinylcinnamate-based, or cyclized rubber-based polymerizable monomer having a reactive vinyl group. Note that, to such photocurable composition, there may be added as necessary a solvent, a binder, a sensitizer, a thickening agent, a coloring agent, a fluorescent agent, an applicability improving agent, a development improving agent, a cross-linking agent, a plasticizer, a flame retardant, or a mold-peeling promoting agent.

In the method for producing a substrate with a fine projection-and-recess pattern according to the present embodiment, the first step S1, the second step S2, the third step S3, the fourth step S4, and the fifth step S5 are sequentially performed, whereby a substrate with a fine projection-and-recess pattern which substrate is excellent in pattern feature size and accuracy can be obtained.

FIGS. 2(a) to 2(e) are partial cross-sectional views to describe an outline of the method for producing a substrate with a fine projection-and-recess pattern according to the present embodiment.

Hereinafter, with reference to FIGS. 2(a) to 2(e), each of the steps will be further described in detail.

(First Step)

As illustrated in FIG. 2(a), the first step S1 is a step at which a photocurable composition 2 is applied to a substrate 1 by printing using a printing plate in accordance with a fixed layout to form a composition-applied substrate 10 including the substrate 1 and printed points 2a formed of the photocurable composition. The use of printing using a printing plate allows a more sufficient amount of the printed points 2a of the photocurable composition to be applied, thereby allowing productivity to be much more increased than in the case of the use of printing without using a printing plate, such as ink-jet printing.

Here, examples of the above-mentioned printing using a printing plate include relief printing, such as resin relief printing and flexographic printing; recess printing, such as gravure printing; planographic printing, such as offset lithography printing; permeographic printing such as mimeographing, stencil printing, and screen printing.

Among these, as the printing using a printing plate, permeographic printing is more preferable in terms of the design of a mask and the controllability of the amount of a resin to be applied.

FIG. 3 is an explanatory diagram to describe the first step in the method for producing a substrate with a fine projection-and-recess pattern according to the present embodiment.

As illustrated in FIG. 3, at the first step S1, first, a printing plate 11 provided with a plurality of openings 11a is disposed on the substrate 1.

Then, the photocurable composition 2 is put within the frame of the printing plate 11, and a squeegee 12 is slid thereacross, whereby the photocurable composition 2 passes through the printing plate 11 to be applied to the substrate 1 via the openings 11a, and thus, the composition-applied substrate 10 provided with a plurality of printed portions 3 formed of a plurality of the printed points 2a is obtained.

The squeegee moving speed when sliding the squeegee 12 is preferably 5 mm/sec to 350 mm/sec. For example, in the case where a plurality of the printed portions 3 are arranged on a 4-inch silicon substrate, with a squeegee moving speed of 20 mm/sec, the application is completed in 5 seconds.

Note that, according to current photolithography, the production rate for applying a photocurable composition to a silicon wafer is 200 sheets/hour, and by contrast, according to the present invention, the production rate for applying the photocurable composition 2 to a silicon wafer (the substrate 1) can be 720 sheets/hour.

Therefore, according to the present invention, the composition-applied substrate 10 obtained by applying the photocurable composition 2 for photo-nanoimprinting to the substrate 1 can be produced at very high rate.

As described above, the use of printing using a printing plate allows the printed points 2a formed of the photocurable composition to be applied to a plurality of portions of the substrate 1 at a time. Thus, the composition-applied substrate 10 provided with a plurality of the printed portions 3 on the substrate 1 is obtained.

Hence, at the first step S1, the printed portions 3 formed of the photocurable composition can be applied only to necessary portions, and accordingly, the amount of the photocurable composition 2 extruded into the projections of a mold can be precisely controlled, and the later-mentioned cured recesses (a so-called residual layer) can be made uniform in thickness.

Furthermore, the photocurable composition 2 can be prevented from being excessively applied, and accordingly, cost reduction can be achieved and the thickness of the residual layer can be prevented from being larger than needed.

At the first step S1, printing using a printing plate is made use of, and therefore, the photocurable composition 2 with high viscosity is suitably used.

At this time, the viscosity of the photocurable composition 2 that is measured at 25° C. is preferably 100 mPa·s or more, more preferably 1,000 mPa·s or more, and still more preferably 1,000 mPa·s to 500,000 mPa·s. In this case, the content of a solvent component (a volatile component) in the photocurable composition 2 can be reduced, thereby preventing a change in physical properties due to the volatilization of the low molecular weight monomer component during the application of the photocurable composition 2 to the substrate 1.

Furthermore, at the first step S1, the above-mentioned high viscosity photocurable composition 2 is used, and in addition, the photocurable composition 2 can be quickly applied by printing using a printing plate, and thus, a change in physical properties due to the volatilization of the photocurable composition 2 can be considerably prevented. Thus, the residual layer can be more uniform in thickness.

Furthermore, the photocurable composition on the substrate hardly changes with passage of time, and therefore, for example, a plurality of the composition-applied substrates 10 can be stored with being accommodated in a cassette. In this case, the composition-applied substrates can be suitably taken out of the cassette and used in a production step.

Furthermore, the production method allows the content of a volatile component, such as a low molecular weight monomer, to be reduced, and is thus excellent as a so-called volatile organic compound (VOC) countermeasure.

At this time, the printed points 2a constituting the printed portion 3 preferably has a minimum diameter L of 10 μm to 50 μm. In this case, it can be prevented that excessive photocurable composition 2 is extruded into projections of a mold, thereby causing the residual layer to be non-uniform in thickness.

At the first step S1, the printing plate 11 (a screen gauze in the case where screen printing is employed as the printing using a printing plate) preferably has a thickness in a range of 5 μm to 200 μm.

When the thickness of the printing plate 11 is less than 5 μm, compared with the case where the thickness of the printing plate 11 is in the above-mentioned range, the mechanical repetition durability of the printing plate 11 is lower, whereby the printing plate 11 is sometimes physically broken. By contrast, when the thickness of the printing plate 11 is more than 200 μm, compared with the case where the thickness of the printing plate 11 is in the above-mentioned range, there is a disadvantage that the thickness of the residual layer is larger.

At the first step S1, the printing plate 11 preferably has an opening ratio in a range of 10% to 40%.

When the opening ratio of the printing plate 11 is less than 10%, compared with the case where the opening ratio of the printing plate 11 is in the above-mentioned range, sometimes a necessary and sufficient amount of the photocurable composition 2 cannot be applied. By contrast, when the opening ratio of the printing plate 11 is more than 40%, compared with the case where the opening ratio of the printing plate 11 is in the above-mentioned range, sometimes excessive photocurable composition 2 is extruded into projections of the mold, thereby causing a residual layer to be non-uniform in thickness, and furthermore, the mechanical repetition durability of the printing plate 11 is lower, whereby the printing plate 11 is sometimes physically broken.

At the first step S1, the openings of the printing plate 11 preferably have a dot shape or a line shape. In this case, the drainage of the photocurable composition 2 is good, and the photocurable composition 2 can be applied with good reproducibility.

Accordingly, the shape of the printed points 2a is a dot or line shape correspondingly similar to the shape of the openings. That is, the printed portion 3 is an aggregate of dot-shaped or line-shaped printed points 2a.

(Second Step and Third Step)

Referring back to FIG. 2(b), the second step S2 is a step of pressing a mold 20 provided with a fine projection-and-recess pattern into contact with the composition-applied substrate 10 to mold the photocurable composition 2 into recesses 5a and projections 5b. That is, the recesses 5a formed of the photocurable composition 2 are formed by projections of the mold 20 pressed thereon, and by contrast, the projections 5b formed of the photocurable composition 2 are formed by recesses of the mold 20 pressed thereon. Note that the width of the recesses of the mold 20 (the diameter in the case where the recesses are circular) is typically 10 nm to 1 µm.

As illustrated in FIG. 2(c), the third step S3 is a step of irradiating the photocurable composition 2 with an active energy line to cure the photocurable composition 2 of the recesses 5a and the projections 5b and peeling off the mold 20, thereby forming a first intermediate 31. Note that the cured recesses correspond to the so-called residual layer.

Here, the active energy line is not limited to a particular one as long as an active energy line can cure the photocurable composition 2, and examples of the active energy line include ultraviolet rays, visible rays, and infrared rays.

In the first intermediate 31, the thickness H of the cured recesses 5a (the residual layer) is preferably half or less than half, and more preferably less than half the thickness of the cured projections 5b.

This allows the width of the cured projections 5b to be reduced in the case where oxygen reactive ion etching is performed at the later-mentioned fourth step S4. Note that, even in the case where oxygen reactive ion etching with a high anisotropy ratio is performed, as long as the thickness H of the cured recesses 5a (the residual layer) is half or less than half the thickness of the cured projections 5b, the width of the projections can be sufficiently maintained.

The standard deviation of the thickness of the cured recesses 5a (the residual layer) is in a range of preferably 10% or less of the thickness (the film thickness of the residual layer), and more preferably 5% or less of the thickness.

When the standard deviation is smaller, pattern feature size and accuracy are more excellent. That is, when the standard deviation is more than 10% of the thickness of the residual layer, there is a disadvantage that a photoresist mask disappears or the line width of the projections considerably becomes small after the later-mentioned fourth step S4, compared with the case where the standard deviation is in the above-mentioned range.

Figure 4:
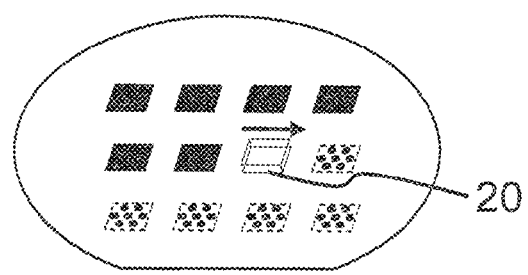
FIG. 4 is an explanatory diagram to describe a second step and a third step in the method for producing a substrate with a fine projection-and-recess pattern according to the present embodiment.

FIG. 4 is an explanatory diagram to describe the second step and the third step in the method for producing a substrate with a fine projection-and-recess pattern according to the present embodiment.

As illustrated in FIG. 4, first, as the second step S2, a mold is pressed into contact with one of the plurality of the printed portions 3 on the substrate 1 to which the photocurable composition 2 is applied. Then, as the third step S3, the printed portion 3 is irradiated with an active energy line by an active energy line irradiation apparatus (not illustrated) to cure the photocurable composition 2 of the recesses 5a and the projections 5b, and the mold 20 is peeled off.

Then, with the mold 20 moving laterally, the second step S2 and the third step S3 are repeated in this order. That is, the plurality of the printed portions 3 are provided on the substrate 1 through the first step S1, and the second step S2 and the third step S3 are repeated with the mold 20 moving laterally so that these distinct printed portions 3 are sequentially subjected to the steps.

This allows the photocurable composition 2 of all the plurality of the printed portions 3 on the substrate to be easily molded into recesses 5a and projections 5b.

The first intermediate 31 is thus obtained.

Here, in the method for producing a substrate with a fine projection-and-recess pattern according to the present embodiment, as described above, the photocurable composition 2 has a high viscosity, whereby a change in physical properties due to volatilization is hardly caused and a stable process becomes feasible. Therefore, at the first step S1, the photocurable composition 2 can be applied to a plurality of portions on the substrate 1 at a time, and also, as described above, with the mold 20 moving laterally, the second step S2 and the third step S3 can be repeatedly performed for every printed portion 3.

Hence, the method for producing a substrate with a fine projection-and-recess pattern according to the present embodiment is very excellent in productivity.

Furthermore, the photocurable composition on the substrate hardly changes with passage of time, and therefore, for example, a plurality of the composition-applied substrates 10 can be stored with being accommodated in a cassette. In this case, the composition-applied substrates can be suitably taken out of the cassette and used in a production step.

Furthermore, the production method allows the content of a volatile component, such as a low molecular weight monomer, to be reduced, and is thus excellent as a so-called volatile organic compound (VOC) countermeasure.

Incidentally, in the case where a low viscosity photocurable composition 2 is applied to the substrate 1 by a conventional spin-coating process or a conventional ink-jet printing process serving as printing without using a printing plate, a change in the physical properties occurs due to volatilization, and therefore, when, with the mold 20 moving laterally, the mold 20 is sequentially pressed into contact with the photocurable composition 2 that is applied to the substrate 1 and let stand for 3 minutes or longer, a serious quality deterioration is caused.

(Fourth Step)

Referring back to FIG. 2(d), the fourth step S4 is a step of completely removing the cured recesses of the first intermediate 31 and etching the substrate located on the lower surface of the recesses 5a to form a second intermediate 32.

Note that, depending on the type of gas for reactive ion etching or plasma etching, some of the projections 5b are removed.

At the fourth step S4, a well-known process is suitably employed for the etching.

Such etching process may be, for example, a wet etching process in which the first intermediate 31 is immersed in an etchant to perform etching treatment, or may be a dry etching process in which the first intermediate 31 is exposed to a reactive ion gas or a plasma gas to perform etching treatment.

Alternatively, the etching process may be an etching process in which an etchant is sprayed on the first intermediate 31.

Alternatively, the etching process may be a two-stage etching process in which, to remove the cured recesses 5a of the first intermediate 31, the first intermediate 31 is exposed to oxygen, nitrogen, or a reactive ion etching gas formed of a mixed gas thereof, and subsequently, in the case where the substrate 1 is a silicon wafer, the first intermediate 31 is exposed to CHF3, SF6, or a reactive ion etching gas of formed of a mixed gas thereof.

(Fifth Step)

As illustrated in FIG. 2(e), the fifth step S5 is a step of removing the remaining cured projections 5b of the second intermediate 32. That is, the fifth step S5 is a step of immersing the second intermediate 32 in a well-known (resist) peeling liquid to peel off the projections 5b.

Alternatively, to remove the projections 5b, a peeling liquid may be sprayed on the second intermediate 32.

Alternatively, the second intermediate 32 may be exposed to an oxygen reactive ion etching gas to remove the projections 5b.

As described above, in accordance with the method for producing a substrate with a fine projection-and-recess pattern according to the present embodiment, the first step S1 to the fifth step S5 described above are sequentially performed, whereby a substrate with a fine projection-and-recess pattern 50 can be obtained.

Such method for producing the substrate with a fine projection-and-recess pattern 50 is excellent in productivity, and the obtained substrate with a fine projection-and-recess pattern 50 is excellent in pattern feature size and accuracy.

The substrate with a fine projection-and-recess pattern 50 according to the present embodiment can be suitably used for, for example, a semiconductor circuit, a flash memory, and a waveguide for communication infrared rays in the case where the substrate 1 is a silicon wafer; suitably used for, for example, a mold for nanoimprinting, a linear polarizer, a visible light reflective element, a microlens array, a flow path device for cells and proteins in the case where the substrate 1 is a glass (quartz) wafer; and suitably used for, for example, a light emitting diode element (LED element) in the case where the substrate 1 is a gallium nitride wafer.

The preferred embodiment of the present invention has been described above, but the present invention is not limited to the above embodiment.

For example, in the method for producing the substrate with a fine projection-and-recess pattern 50 according to the present embodiment, the first step S1, the second step S2, the third step S3, the fourth step S4, and the fifth step S5 are sequentially performed, but, for example, a washing step of washing by water may be performed between the steps.

Alternatively, after the third step S3, another well-known photocurable composition that is highly resistant to resists is applied, and at the fourth step S4, the resultant intermediate may be used for a reverse process to produce a reversal pattern.

In the method for producing the substrate with a fine projection-and-recess pattern 50 according to the present embodiment, the printed points 2a formed of the photocurable composition are provided in a plurality of portions on the substrate 1 through the first step S1, but, may be provided in the whole of the substrate 1.

Furthermore, in the method for producing the substrate with a fine projection-and-recess pattern 50 according to the present embodiment, with the mold 20 moving laterally, the second step S2 and the third step S3 are repeatedly performed, but, after the first step S1, the second step S2 and the third step S3 may be each performed once without moving the mold 20 laterally.

EXAMPLES

Hereinafter, the present invention will be more specifically described based on Examples and Comparative Examples, but, the present invention is not limited to the following examples.

Example 1

As a substrate, a 4-inch silicon wafer having a thickness of 0.525 μm was used.

As a photocurable composition, a composition obtained by mixing a polymerizable monomer (glycerol 1,3-diglycerolate diacrylate) with a photopolymerization initiator (Irgacure 907) and a fluorescent agent (fluorescence dye) (Rhodmine 6G tetrafluoroborate) was used.

Note that the viscosity of the photocurable composition measured at 25° C. was 12,800 mPa·s.

As a mold, a non-uniform volume $SiO_2$ mold (PH350, manufactured by NTT Advanced Technology Corporation) having a mold recess depth of 350 nm and a pattern formed of lines having a width ratio of line to space of 1:1, 1:2, and 1:5, and a width of 350 nm to 10 μm, dots, and holes was used. FIG. 5 illustrates a fine projection-and-recess pattern of the employed mold.

As a photo-nanoimprinting device, ImpFlex Essential, manufactured by Sanmei Electronics Co., Ltd., was used.

The photocurable composition was applied to the substrate by screen printing at a squeegee moving speed of 20 mm/sec, whereby a composition-applied substrate was formed (First step S1). Note that an employed screen gauze (printing plate) had a thickness of 16 μm, a diameter of openings of 18 μm, a cycle of 45 μm, and an opening ratio of 13%.

Next, the mold was pressed into contact with the composition-applied substrate to mold the photocurable composition into recesses and projections (Second step S2).

Next, the molded photocurable composition was irradiated with ultraviolet rays (irradiation wave length: 365 nm, irradiation intensity: 100 mW/cm$^2$) for 10 seconds to cure the photocurable composition of the recesses and the projections, and the mold was peeled off, whereby a first intermediate was formed (Third step S3). At this time, the thickness of the recesses (residual layer) cured at a line-and-space ratio of 1:1 was in a range of 200 nm to 210 nm, the standard deviation of the thickness of the recesses was 5 nm, which was 2.4% of the film thickness of the residual layer.

Next, a dry etching treatment using SF6/CHF3/02 as a reactive gas (Fourth step S4) and a removal treatment by dry etching using oxygen as a reactive gas (Fifth step S5) were performed to obtain Sample 1 of a substrate with a fine projection-and-recess pattern.

Example 2

Sample 2 was obtained in the same manner as in Example 1, except that dipropenoic acid (1-methyl-1,2-ethanediyl)bis[oxy(2-hydroxy-3,1-propanediyl)]ester was used as a polymerizable monomer contained in the photocurable composition. Note that the viscosity of the photocurable composition measured at 25° C. was 1,230 mPa·s.

Example 3

Sample 3 was obtained in the same manner as in Example 1, except that a mixture of dipropenoic acid (1-methyl-1,2-ethanediyl)bis[oxy(2-hydroxy-3,1-propanediyl)]ester and bisphenol A glycerolate dimethacrylate was used as a polymerizable monomer contained in the photocurable composition. Note that the viscosity of the photocurable composition measured at 25° C. was 100,000 mPa·s.

Comparative Example 1

Sample 4 was obtained in the same manner as in Example 1, except that, by a spin-coating process, the photocurable composition was applied to the substrate. Note that, at this time, the thickness of the recesses (residual layer) cured at a line-and-space ratio of 1:1 was in a range of 480 nm to 870 nm, and the standard deviation of the thickness thereof was 195 nm, which was 28.9% of the thickness of the residual layer.

Comparative Example 2

Sample production was performed in the same manner as in Example 1, except that 1-acryloxy-2-hydroxyl-3-methacryloxypropane was used as a polymerizable monomer contained in the photocurable composition, but, the resultant photocurable composition has a low viscosity, thereby leaking out of an employed screen printing plate, and causing a failure to produce a sample. Note that the viscosity of the photocurable composition measured at 25° C. was 44 mPa·s.

(Evaluation 1: Observation of Volatility of Photocurable Composition)

Figure 6A:
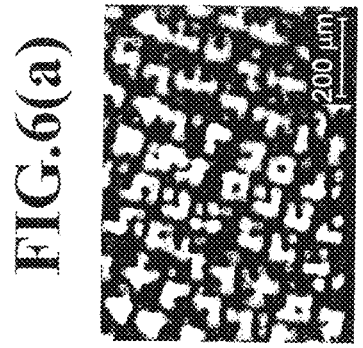
FIGS. 6(a), 6(b), and 6(c) are photographs showing the results of Evaluation 1 of Example 1.
Figure 6B:
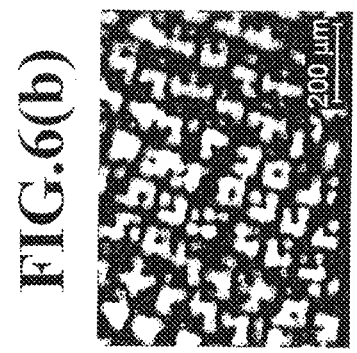
Figure 6C:
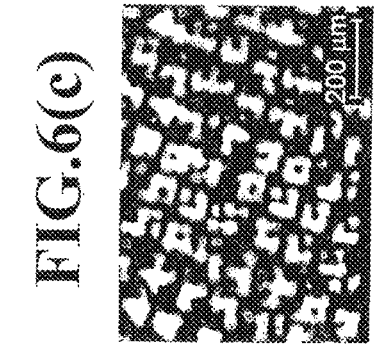

A composition-applied substrate obtained by applying the photocurable composition used in Example 1 to a silicon wafer and a composition-applied substrate obtained by applying the photocurable composition used in Comparative Example 2 to a silicon wafer were let stand, and observed with time, while fluorescence microscope photographs of these composition-applied substrates were taken. FIGS. 6(a), 6(b), and 6(c) are photographs taken in Example 1. Note that FIG. 6(a) is a photograph taken 2 minutes after the production of the composition-applied substrate, FIG. 6(b) is a photograph taken 3 hours after the production of the composition-applied substrate, and FIG. 6(c) is a photograph taken 12 hours after the production of the composition-applied substrate.

Figure 7A:
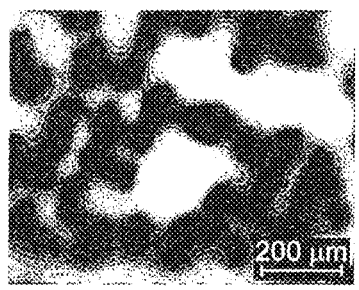
FIGS. 7(a) and 7(b) are photographs showing the results of Evaluation 1 of Comparative Example 2.
Figure 7B:
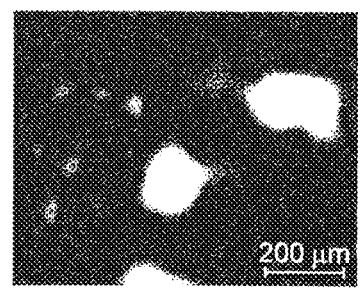

The low viscosity photocurable composition used in Comparative Example 2 leaked out of an employed screen printing plate, resulting in a failure to form a printed point 2a, but, the photocurable composition remaining in the screen printing plate was pressed into contact with a silicon wafer to form a composition-applied substrate. FIGS. 7(a) and 7(b) are photographs taken in thus-obtained Comparative Example 2. Note that, FIG. 7(a) is a photograph taken 2 minutes after the production of the composition-applied substrate, and FIG. 7(b) is a photograph taken 3 hours after the production of the composition-applied substrate.

The results of Evaluation 1 revealed that, in the composition-applied substrate of Example 1, the form of the photocurable composition had no change caused by volatilization.

By contrast, it was revealed that, in the composition-applied substrate of Comparative Example 1 using the low viscosity photocurable composition having a viscosity of 44 mPa·s, the form of the photocurable composition had a change caused by volatilization.

(Evaluation 2: Visual Observation of Unevenness in Film Thickness of Residual Layer)

Figure 8A:
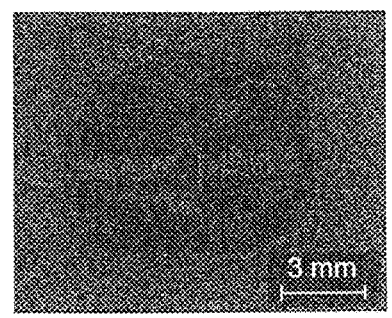
FIGS. 8(a) and 8(b) are photographs showing the results of Evaluation 2 of Examples.
Figure 8B:
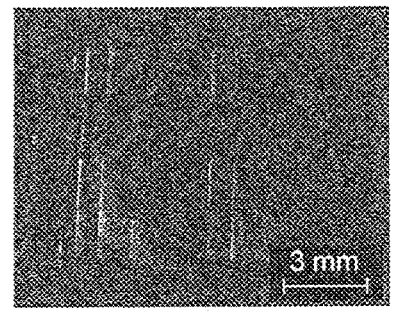

Each of the first intermediates obtained after the third step in Example 1 and Comparative Example 1 was photographed with a digital camera and observed. FIGS. 8(a) and 8(b) are thus-obtained photographs. Note that FIG. 8(a) is a photograph of the first intermediate obtained in Example 1, and FIG. 8(b) is a photograph of the first intermediate obtained in Comparative Example 1.

The results of Evaluation 2 revealed that no interference fringe was observed in FIG. 8(a), and hence, the residual layer was uniformly formed. By contrast, it was revealed that interference fringes were observed in FIG. 8(b), and hence, the residual layer was non-uniformly formed in an approximately circular form around the center portion of the pattern corresponding to the center portion of the mold.

(Evaluation 3: Fluorescence Microscope Observation of Unevenness in Film Thickness of Residual Layer)

Each of the first intermediates obtained after the third step in Example 1 and Comparative Example 1 was photographed with a fluorescence microscope, and whether or not there was the unevenness in film thickness of the residual layer was observed. Note that an optical microscope, BX-51, manufactured by Olympus Corporation was employed as the fluorescence microscope. Specifically, using a fluorescence cube (Olympus U-MWIGA3, excitation wavelength range: 530 nm to 550 nm, detection wavelength range: 575 nm to 625 nm), an objective lens (Olympus UPlanSAPo 10×/0.40), a CCD camera (ORCA-R2, manufactured by Hamamatsu Photonics K.K.), and an image analysis software (WinRoof, manufactured by MITANI CORPORATION), fluorescence microscope images were photographed, and an analysis of fluorescence intensity was performed.

Figure 9:
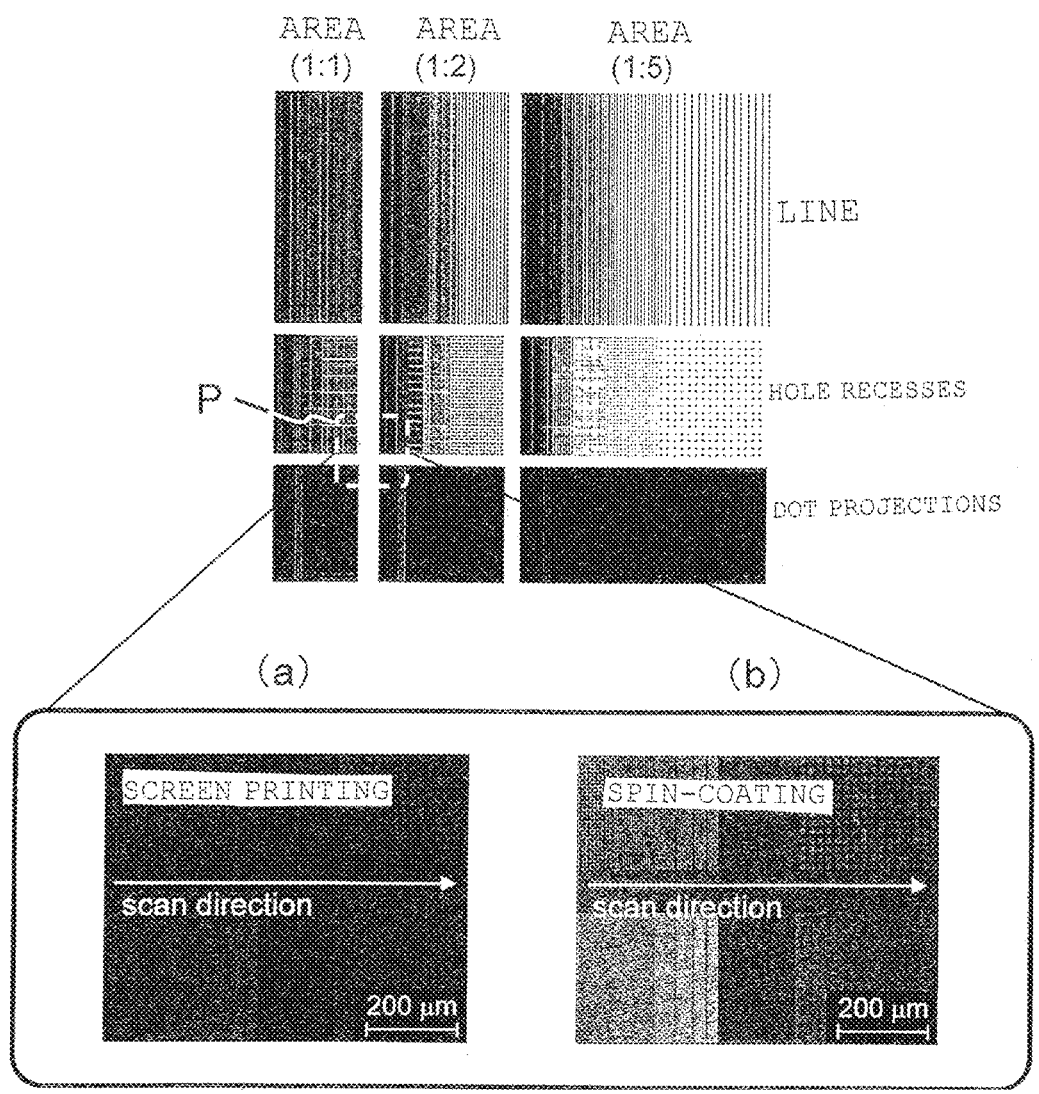
FIGS. 9(a) and 9(b) are enlarged fluorescence microphotographs of a portion of a first intermediate that corresponds to a portion P of a mold pattern in Evaluation 3 of Examples.

FIGS. 9(a) and 9(b) are the obtained photographs. Incidentally, FIG. 9(a) is a fluorescence microphotograph of a portion of the first intermediate obtained in Example 1, the portion corresponding to a portion P of the pattern of the mold, and FIG. 9(b) is a fluorescence microphotograph of a portion of the first intermediate obtained in Comparative Example 1, the portion corresponding to a portion P of the pattern of the mold.

Figure 10:
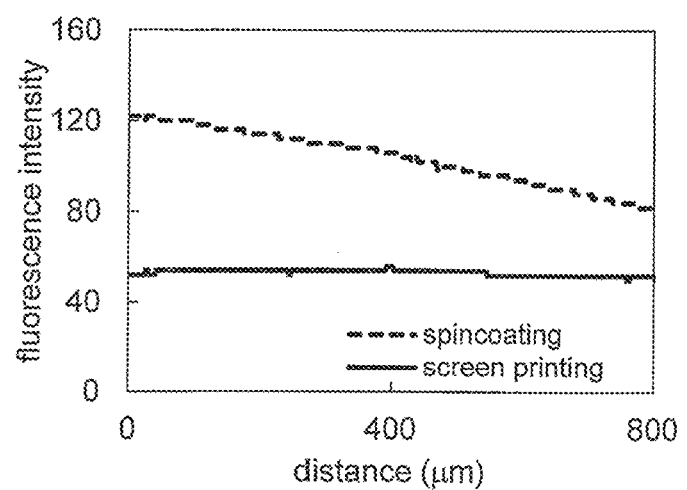
FIG. 10 is a graph illustrating the results of measuring the thickness of a residual layer in a portion marked with an arrow in FIGS. 9(a) and 9(b) on the basis of fluorescence intensity.

FIG. 10 is a graph showing the measurement results of the thickness of a residual layer portion indicated by an arrow in FIGS. 9(a) and 9(b) in terms of fluorescence intensity. Incidentally, in FIG. 10, the horizontal axis represents distance, and the vertical axis represents fluorescence intensity.

The results of Evaluation 3 revealed that, in the first intermediate of Example 1, the fluorescence intensity was uniform and the film thickness of the residual layer was constant. By contrast, it was revealed that, in the first intermediate of Comparative Example 1, the fluorescence intensity decreased with an increase in distance, and the film thickness of the residual layer was non-uniform.

(Evaluation 4-1: Film Thickness Measurement of Residual Layer with Scanning Electron Microscope)

Figure 11:
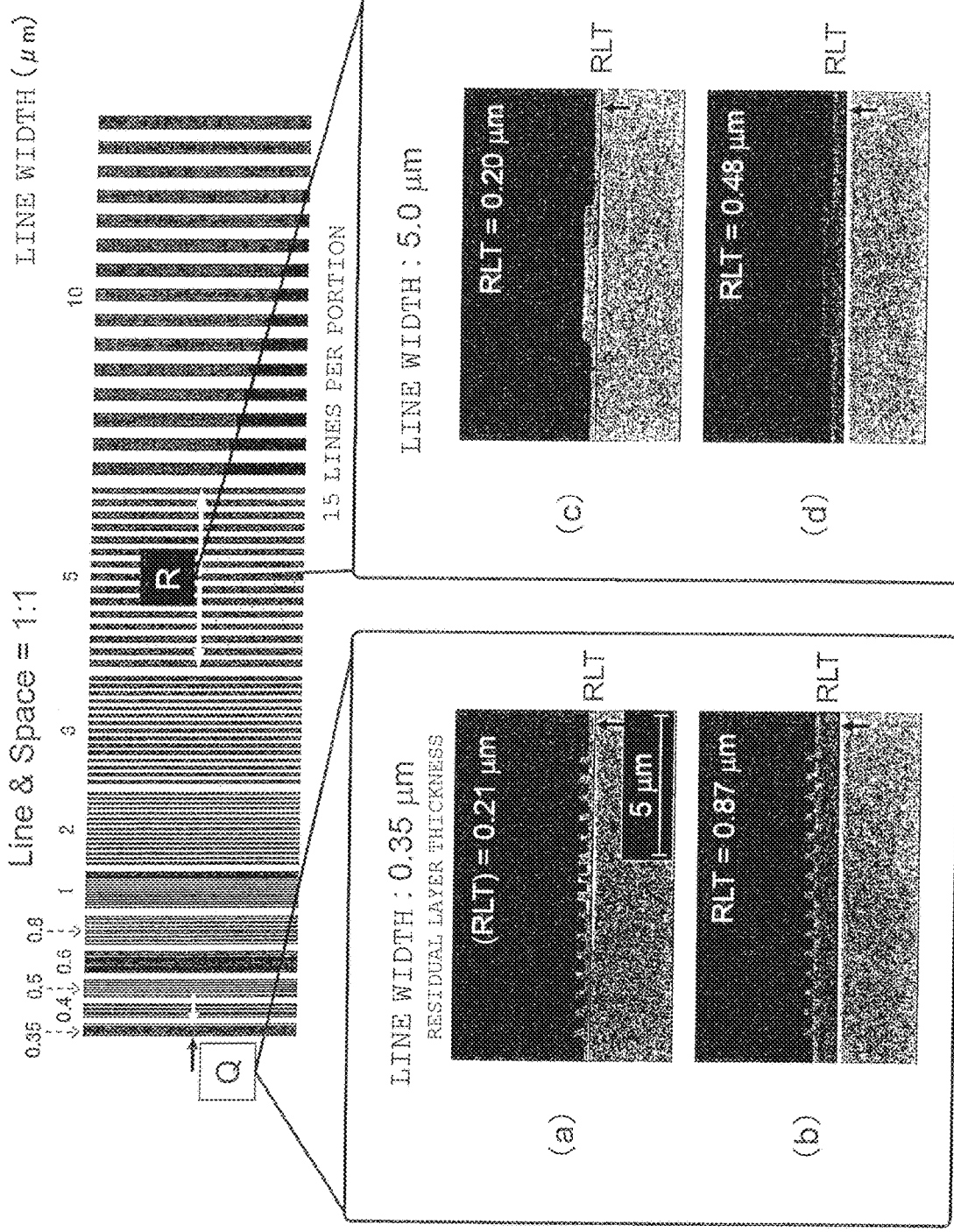
FIGS. 11(a) and 11(b) are enlarged scanning electron microphotographs of a portion of the first intermediate that corresponds to a portion Q of the mold pattern in Evaluation 4 of Examples.
FIGS. 11(c) and 11(d) are enlarged scanning electron microphotographs of a portion of the first intermediate that corresponds to a portion R of the mold pattern in Evaluation 4 of Examples.

Each of the first intermediates after the third step in Example 1 and Comparative Example 1 was broken at a portion corresponding to a pattern portion Q (line width: 350 nm, space width: 350 nm) of the mold illustrated in FIG. 11, and the portion was photographed with a scanning electron microscope (S-4800, manufactured by Hitachi High-Technologies Corporation) and observed. FIGS. 11(a) and 11(b) are the obtained photographs. Incidentally. FIG. 11(a) is a photograph of the first intermediate obtained in Example 1, and FIG. 11(b) is a photograph of the first intermediate obtained in Comparative Example 1.

The results of Evaluation 4-1 revealed that, in the first intermediate of Example 1, the film thickness of the residual layer was 210 nm. By contrast, in the first intermediate of Comparative Example 1, the film thickness of the residual layer was 870 nm.

(Evaluation 4-2: Film Thickness Measurement of Residual Layer with Scanning Electron Microscope)

Each of the first intermediates after the third step in Example 1 and Comparative Example 1 was broken at a portion corresponding to a pattern portion R (line width: 5,000 nm, space width: 5,000 nm) of the mold illustrated in FIG. 11, and the portion was photographed with a scanning electron microscope (S-4800, manufactured by Hitachi High-Technologies Corporation) and observed. FIGS. 11(c) and 11(d) are the obtained photographs. Incidentally, FIG. 11(c) is a photograph of the first intermediate obtained in Example 1, and FIG. 11(d) is a photograph of the first intermediate obtained in Comparative Example 1.

The results of Evaluation 4-2 revealed that, in the first intermediate of Example 1, the film thickness of the residual layer was 200 nm. By contrast, in the first intermediate of Comparative Example 1, the film thickness of the residual layer was 480 nm.

Hence, the results of Evaluation 4-1 and Evaluation 4-2 revealed that the film thickness of the residual layer (the thickness of the recesses 5a) of the first intermediate of Example 1 according to the present invention was approximately uniform, and by contrast, the thickness of the residual layer (the thickness of the recesses 5a) of the first intermediate of Comparative Example 1 not according to the present invention was larger.

The results of Evaluations 1 to 4 revealed that, in the first intermediate of Example 1 according to the present invention, from both macroscopic and microscopic viewpoints, the thickness of the residual layer was relatively uniform, and there was little unevenness in the thickness. By contrast, it was revealed that, in the first intermediate of Comparative Example 1 not according to the present invention, the thickness of the residual layer was non-uniform, and there were much unevenness in the thickness.

Hence, it was confirmed that the method for producing a substrate with a fine projection-and-recess pattern according to the present invention enables the achievement of a substrate with a fine projection-and-recess pattern which substrate is excellent in pattern feature size and accuracy.

INDUSTRIAL APPLICABILITY

The present invention is suitably applied to a method for producing a substrate with a fine projection-and-recess pattern which substrate is suitably used for such as semiconductor elements and optical elements, and applied to a substrate with a fine projection-and-recess pattern obtained by the method. The present invention enables the achievement of excellent productivity and excellent pattern feature size and accuracy.

REFERENCE SIGNS LIST

1 . . . substrate,
2 . . . photocurable composition,
2a . . . printed point,
3 . . . printed portion,
5a . . . recess,
5b . . . projection,
10 . . . composition-applied substrate,
11 . . . printing plate,
1a . . . opening,
12 . . . squeegee,
20 . . . mold,
31 . . . first intermediate,
32 . . . second intermediate,
50 . . . substrate with a fine projection-and-recess pattern,
S1 . . . first step,
S2 . . . second step,
S3 . . . third step,
S4 . . . fourth step,
S5 . . . fifth step,

The invention claimed is:

1. A method for producing a substrate with a fine projection-and-recess pattern by photo-nanoimprint lithography, the method comprising:
   a first step of applying a photocurable composition to a substrate to form a composition-applied substrate;
   a second step of pressing a mold provided with a fine projection-and-recess pattern into contact with the composition-applied substrate to mold the photocurable composition into projections and recesses;
   a third step of irradiating the photocurable composition with an active energy line to cure the photocurable composition of the projections and the recesses and peeling off the mold;
   a fourth step of removing the cured recesses and etching the substrate located on a lower surface of the recesses; and
   a fifth step of removing the cured projections,
   wherein, at the first step, the photocurable composition is applied to the substrate by printing using a printing plate,
   wherein the printing using a printing plate is permeographic printing,
   wherein the printing plate has a thickness of 5 μm to 200 μm and an opening ratio of 10% to 40%, and
   wherein openings of the printing plate have a dot shape or a line shape.

2. The method for producing a substrate with a fine projection-and-recess pattern according to claim 1,
   wherein, at the first step, the photocurable composition is applied to a plurality of portions of the substrate by one time printing using a printing plate.

3. The method for producing a substrate with a fine projection-and-recess pattern according to claim 1,
   wherein the mold is moved laterally to repeat the second step and the third step for every printed portion of the substrate to which the photocurable composition is applied.

4. The method for producing a substrate with a fine projection-and-recess pattern according to claim 1,
   wherein the photocurable composition has a viscosity of 100 mPa·s or higher.

5. A method for producing a substrate with a fine projection-and-recess pattern by photo-nanoimprint lithography, the method comprising;
- a first step of applying a photocurable composition to a substrate to form a composition-applied substrate;
- a second step of pressing a mold provided with a fine projection-and-recess pattern into contact with the composition-applied substrate to mold the photocurable composition into projections and recesses;
- a third step of irradiating the photocurable composition with an active energy line to cure the photocurable composition of the projections and the recesses and peeling off the mold;
- a fourth step of removing the cured recesses and etching the substrate located on a lower surface of the recesses; and
- a fifth step of removing the cured projections,
- wherein, at the first step, the photocurable composition is applied to the substrate by printing using a printing plate,
- wherein the printing using a printing plate is permeographic printing,
- wherein the printing plate has a thickness of 5 μm to 200 μm and an opening ratio of 10% to 40%, and
- wherein a standard deviation of thickness of the cured recesses is 10% or less of the thickness.

6. The method for producing a substrate with a fine projection-and-recess pattern according to claim 5,
- wherein, at the first step, the photocurable composition is applied to a plurality of portions of the substrate by one time printing using a printing plate.

7. The method for producing a substrate with a fine projection-and-recess pattern according to claim 5,
- wherein the mold is moved laterally to repeat the second step and the third step for every printed portion of the substrate to which the photocurable composition is applied.

8. The method for producing a substrate with a fine projection-and-recess pattern according to claim 5,
- wherein the photocurable composition has a viscosity of 100 mPa·s or higher.

* * * * *